(12) United States Patent
Loke et al.

(10) Patent No.: US 6,327,462 B1
(45) Date of Patent: Dec. 4, 2001

(54) SYSTEM AND METHOD FOR DYNAMICALLY VARYING OPERATIONAL PARAMETERS OF AN AMPLIFIER

(75) Inventors: Aravind Loke; Mohy F. Abdelgany, both of Irvine, CA (US); James F. Kamke, Riverside, IL (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/222,686

(22) Filed: Dec. 29, 1998

(51) Int. Cl.[7] .............................. H01Q 11/12; H04B 1/04
(52) U.S. Cl. ........................ 455/127; 455/91; 455/126
(58) Field of Search ................................... 455/126, 115, 455/91, 116, 127; 330/129, 295

(56) References Cited

U.S. PATENT DOCUMENTS

| | | | |
|---|---|---|---|
| 5,710,991 | * | 1/1998 | Lee ........................................ 455/126 |
| 6,097,251 | * | 8/2000 | Khullar ................................. 330/129 |
| 6,122,488 | * | 9/2000 | Leizerovich .......................... 455/78 |

OTHER PUBLICATIONS

Data Sheet of RI 23107U Personal Communication Services (PCS) Power Amplifier (1850–1910 MHz); Rockwell Semiconductor Systems, Aug. 25, 1998.

TIA/EIA Engineering Standards Proposal No. 3815 for ANSI/TIA/EIA–98B; Published by ©Telecommunications Industry Association 1997.

* cited by examiner

*Primary Examiner*—Vivian Chang
*Assistant Examiner*—James K Moore
(74) *Attorney, Agent, or Firm*—Knobbe, Martens, Olson & Bear. LLP (57) ABSTRACT

A wireless communications device uses an amplifier module to transmit signals. The amplifier module is configured to amplify a signal. The amplifier module includes an amplifier circuit and a control module. The control module is configured to vary the operating parameters of the amplifier circuit based on a desired output power level. The control module relies on stored data values to dynamically vary the operating parameters of the amplifier circuit so as to increase the efficiency of the amplifier circuit.

26 Claims, 7 Drawing Sheets

SYSTEM AND METHOD FOR DYNAMICALLY VARYING OPERATIONAL PARAMETERS OF AN AMPLIFIER

BACKGROUND OF THE INVENTION

1. Field of the Invention

The invention generally relates to electronic devices. More particularly, the invention relates to a communications device and a transmitter included therein.

2. Background

There is an ever present need to reduce the power consumption of electronic devices. For example, a laptop computer or a wireless phone typically includes a battery to store and provide electrical energy for the operation of the electronic device. A user can operate the electronic device through the battery when no other source of electrical energy is available, or when the user wants to be mobile. Batteries, however, store only a limited amount of electrical energy, which is consumed by the electronic device.

The batteries, thus, have to be recharged after the electronic device has been used for a certain time. The time interval between two subsequent charging events is expressed as operating time. In wireless phones, for example, the operating time can further be divided into a stand-by time and a talk time.

The user of a wireless communications device such as a mobile unit or a cellular phone typically desires to have an operating time, particularly a talk time, which is as long as possible. Additionally, the user generally expects the wireless device to be as small and as light as possible. Because the operating time is dependent from the capacity and, thus, usually from the size of the battery, small size, low weight, long operating time of the wireless device are often contradictory expectations.

To fulfill these expectations, manufacturers seek to increase the capacity of the batteries without increasing the size and weight of the batteries. In addition, manufacturers of wireless devices have developed wireless devices operate at lower voltages, for example 3.3 volts, to increase the stand-by time and the talk time.

SUMMARY OF THE INVENTION

In one embodiment, a communications device uses an amplifier module to transmit signals. The amplifier module is configured to amplify a signal. The amplifier module includes an amplifier circuit and a control module. The control module is configured to vary the operating parameters of the amplifier circuit based on a desired output power level. The control module relies on stored data values to dynamically vary the operating parameters of the amplifier circuit so as to increase the efficiency of the amplifier circuit.

The transmit power of a communication device, typically varies depending on the transmit conditions, the proximity of the communications device to a base station, etc. For example, a communications device may transmit at maximum power when poor transmit conditions exist. In many devices, the output power amplifier is optimized to generate the maximum power output.

If the transmit conditions are favorable or a communications device is near the base station, the communications device often transmits at less than the maximum output power. Statistically speaking, a commutations device typically spends most of its operational time transmitting at less than maximum power. For example, in a code division multiple access (CDMA) cellular phone, most of the time to the phone operates below the maximum power output level within a range from about −5 dBm (measured decibels referenced to a power of 1 milliwatt) to about 8 dBm. Accordingly, one embodiment of the invention increases the output power efficiency when an electronic devices operates at a low output power level.

In another embodiment of the invention, a wireless communications device has an amplifier module which is configured to amplify a radio frequency (RF) signal with increased efficiency. The amplifier module comprising an input terminal which receives a control signal comprising a plurality of pulses, wherein the number of pulses within a predetermined time period identify a desired power level.

The amplifier module further comprising a control circuit in communication with the control signal. The control circuit comprising at least one counter which counts the number of pulses occurring within the predetermined time period so as to generate a control value.

The amplifier module further comprising a first memory array in communication with the control value. The first memory array comprising multiple entries, each entry comprising a power value, wherein the first memory outputs the power value which corresponds to the control value. The amplifier module further comprising a second memory array in communication with the control value. The second memory array comprising multiple entries, each entry comprising a bias value, wherein the second memory outputs the bias value which corresponds to the control value.

The amplifier module further comprising an amplifier circuit which is in communication with the power value, the bias value and a radio frequency (RF) signal. The amplifier circuit is configured to vary the amplification of the radio frequency signal based on the power and bias values, wherein the power and bias values increase the efficiency of the amplifier circuit at the desired power level.

In another embodiment, the power values determine the amount of power voltage applied to the amplifier circuit. In yet another embodiment, the bias values determine the amount of bias voltage applied to the amplifier circuit. In an additional embodiment, the first and second memory arrays are located in a single memory array.

In one embodiment, the power value is a digital power value. In another embodiment, the communications device further comprises a digital-to-analog converter which converts the digital power value to an analog power value. In yet another embodiment, the bias value is a digital bias value. In an additional embodiment, the communications device further comprises a digital-to-analog converter which converts the digital bias value to an analog bias value.

In one embodiment, the radio frequency signal is a Global System for Mobile Communications (GSM) communications signal. In another embodiment, the radio frequency signal is a Personal Communications System (PCS) communications signal. In yet another embodiment, the radio frequency signal is an Advanced Mobile Phone Systems (AMPS) communications signal.

In one embodiment, the radio frequency signal is compatible with the code division multiple access (CDMA) standard. In another embodiment, the radio frequency signal is compatible with the frequency division multiple access (FDMA) standard. In yet another embodiment, the radio frequency signal is compatible with the time division multiple access (TDMA) standard.

One embodiment of the invention relates to an amplifier control circuit comprising an input which receives a first signal indicative of a desired power level. The amplifier control circuit further comprising a memory. The memory comprising a plurality of data values wherein the data values represent amplifier operational parameters.

The amplifier control circuit further comprising a control circuit in communication with the input and the memory. The control circuit configured to access at least one of the data values in the memory in response to the first signal. The control circuit further configured to generate a second signal based on the selected data value.

In one embodiment, the first signal includes pulses of varying duration which are indicative of the desired power level. In another embodiment, the control circuit includes a counter which counts the pulses to generate a value representing the counted pulses within a predetermined period of time. The value being indicative of the desired power level.

In one embodiment, the data values represent values for powering an amplifier circuit. In another embodiment, the data values represent values for biasing an amplifier circuit. In yet another embodiment, the first signal is a digital signal. In an additional embodiment, the first signal transmits a digital value. In another embodiment, the data values represent values for biasing an amplifier circuit.

One embodiment of the invention relates to an amplifier control circuit comprising a first means for storing a plurality of data values wherein the data values represent amplifier operational parameters. The amplifier control circuit further comprising a second means in communication with a first signal that indicates a desired power level. The second means using the first signal to address at least one of the data values in the first means. The second means also generating a second signal based on the addressed data value.

One embodiment of the invention relates to a method for increasing the power efficiency of an amplifier module. The method comprising the act of receiving a first control signal indicative of a power level output of the amplifier module. The method further comprising the act of using the control signal to address memory locations, each memory location storing at least one operating characteristic of the amplifier module. The method further comprising the act of reading from the addressed storage locations to generate at least a second control signal, the second control signal configured to increase the power efficiency of the amplifier module.

In one embodiment, the control signal is a pulse duration modulation signal. In another embodiment, the method further comprising the act of counting the pulses of the control signal within a predetermined period of time to generate a digital value representing the power level. In yet another embodiment, the method further comprising the act of using the digital value to address the storage locations.

BRIEF DESCRIPTION OF THE DRAWINGS

These and other aspects, advantages, and novel features of the invention will become apparent upon reading the following detailed description and upon reference to the accompanying drawings.

DETAILED DESCRIPTION OF THE PREFERRED EMBODIMENTS

Figure 1:
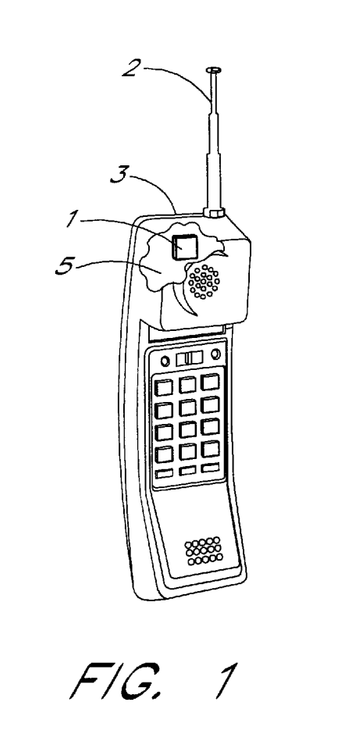
FIG. 1 is a schematic illustration of a wireless communications device cut away to show a portion of the motherboard.

FIG. 1 shows a wireless communications device 3 as an example of an electronic device. Other examples of electronic devices include wireless phones, cordless phones, mobile transmitters, stationary wireless transmitters, personal digital assistants, wireless modems, pagers, wireless fax machines, and other battery operated devices. It is contemplated that the invention is also applicable to a wide range of non-portable electronic devices such as modems, cable modems, fax machines, base stations, land-line based applications, computer network applications and the like. Further, it is contemplated that the invention is generally applicable to a wide range of battery operated devices. Hereinafter, one embodiment of the invention is described with reference to a cellular phone which is one embodiment of the wireless communications device 3.

The cellular phone operates within a mobile communications system. A mobile communications system, for example a code division multiple access (CDMA) system, is structured to have a variety of individual regions called cells, and to comprise a variety of fixed transceiver stations called base transceiver stations, and a plurality of mobile stations, the cellular phones. Usually, one base transceiver station defines one cell and handles telephone traffic to and from the cellular phones which are currently located in the cell.

The wireless communications device 3 is exemplary described as, but not limited to, a wireless phone for a CDMA system. Hereinafter, the wireless communications device 3 is referred to as the phone 3. A portion of the case of the phone 3 is cut away to show a motherboard 5 of the phone 3 with a transmitter module 1 positioned thereon. Although not shown in FIG. 1, those skilled in the art will appreciate that the phone 3 comprises a plurality of other components and functional modules, such as the components included in a receive path and a transmit path. For example, the phone 3 further includes a central processing unit (CPU), an antenna 2, a display and a keypad.

In one embodiment, the transmitter module 1 is configured to emit radio frequency (RF) signals. The transmitter module 1 comprises an amplifier stage for amplifying the RF signals according to electrical characteristics such as a defined nominal effective radiated power (ERP). In cellular CDMA systems, the phones are grouped into three categories Class I, Class II and Class III having different ranges of effective radiated powers. For example, a Class I phone emits an effective radiated power of 1.25 watts to 6.3 watts and a Class III phone emits an effective radiated power of 0.2 watts to 1 watt. Further electrical characteristics are described in TIA/EIA/IS-98A, for example, in Table 10.4.5.3-1.

Regarding operation, it is contemplated that the phone 3 can operate for systems that use the code division multiple access (CDMA), frequency division multiple access (FDMA), and time division multiple access (TDMA) standards. Furthermore, it is contemplated that the phone 3 can operate in frequency bands used for wireless communications. For example, the phone 3 can be configured to receive and transmit data according to the Global System for Mobile Communications (GSM) standard which typically operates in the 900 MHz and 1800 MHz ranges.

Furthermore, the phone 3 can be configured to receive and transmit data according to the Personal Communications System (PCS) standard. In PCS systems, the phone 3 operates in a transmit band between 1850 MHz and 1910 MHz and a receive band between 1930 MHz and 1990 MHz. The phone 3 can also be configured to receive and transmit data according to the Advanced Mobile Phone Systems (AMPS) standard. In an AMPS system, the phone 3 operates in a transmit band between 824 MHz and 849 MHz and a receive band between 869 MHz and 894 MHz.

In addition, it is contemplated that in one embodiment, the phone 3 can be configured to operate as a dual-band phone and as a dual-mode phone. For example, the phone 3 can be configured to include a dual-band transmitter so that the phone 3 can operate both in the CDMA frequency bands and PCS frequency bands. In addition, the phone 3 can be configured as a dual-mode phone to operate in the CDMA mode or in a mode for AMPS communication devices.

Figure 2:
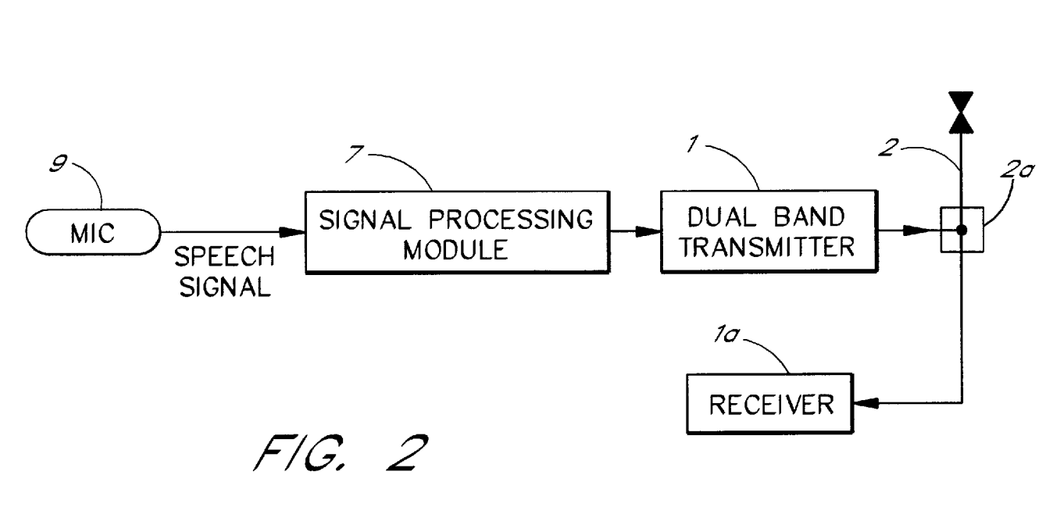
FIG. 2 is an illustration of one embodiment of a transmit path within the wireless communications device shown in FIG. 1.

FIG. 2 illustrates an embodiment of the transmit path of the phone 3. Within the cellular phone 3, the transmitter module 1 and a processing module 7 are positioned on the motherboard 5 and interconnected between the antenna 2 and a microphone 9 of the phone 3. In the illustrated embodiment, the processing module 7 performs most speech and signal processing in a transmit direction, for example, voice encoding and channel encoding. A modulator, included either in the signal processing module 7 or the transmitter module 1, modulates a RF carrier of, for example, about 824 MHz with the processed speech signal. The carrier frequency of 824 MHz is selected from a transmit band defined for CDMA systems. The transmit band is approximately between 824 MHz and 849 MHz. For PCS systems, the RF carrier is selected from the transmit band between 1850 MHz and 1910 MHz as discussed above.

The receive path is indicated by means of a receiver module 1a which includes, for example, a radio frequency (RF) receiver. The transmitter module 1 and the receiver module 1a are connected to the antenna 2 through an electronic switch 2a which connects the antenna 2 either to the transmitter module 1 or the receiver module 1a. The CPU of the phone 3 operates the electronic switch 2a in accordance with a transmission protocol to avoid, for example, that the receiver 1a receives a signal the transmitter module 1 emits. In cellular CDMA systems, for example, a duplexer ensures that the receiver 1a does not receive the signal emitted from the transmitter module 1.

Figure 3:
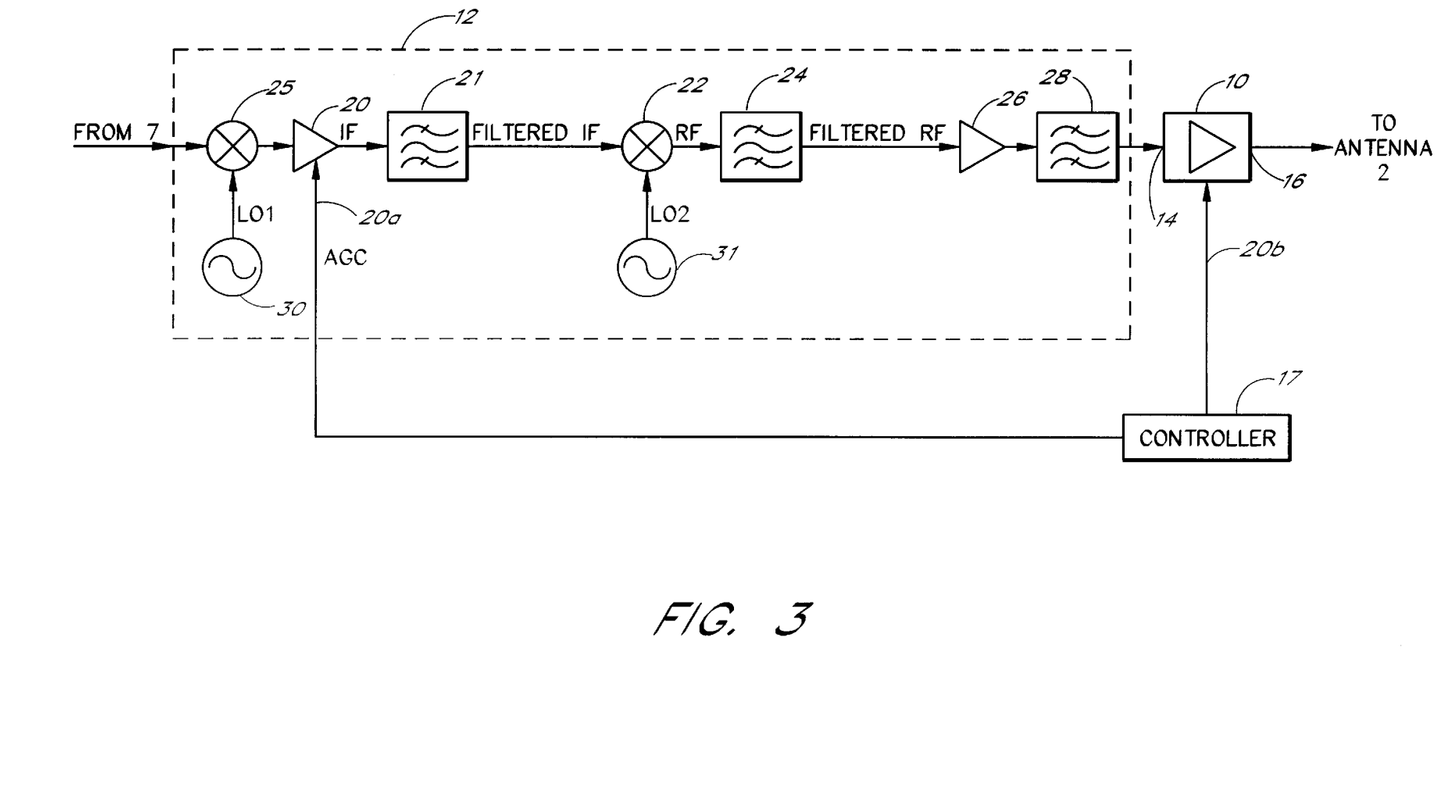
FIG. 3 is a schematic illustration of a first embodiment of a transmitter.

FIG. 3 shows an exemplary block diagram of the transmitter module 1 shown in FIG. 2. Electrical circuits or devices such as the receiver module 1a and the transmitter module 1 can be implemented in a single-ended version or a differential version. The differential version is advantageously used to improve the electrical circuits with respect to noise and undesired signal components. In the differential version, the transmitter module 1 is connected to the signal processing module 7 through two differential lines. The differential lines are typically referred to as inverted and non-inverted, or "+" and "−". The block diagram of FIG. 3, however, shows the transmitter module 1 in the single-ended version. Those skilled in the art will appreciate that a differential version can be implemented by adapting the components to receive, process and output signals on two lines.

The transmitter module 1 includes a modulator module 12 and an amplifier module 10. The modulator module 12 is connected between the signal processing module 7 and the amplifier module 10. The modulator module 12 includes mixer and driver stages as described below. In one embodiment, the amplifier module 10 is a multiple-stage amplifier operating as a power amplifier. An input 14 of the amplifier module 10 is connected to the modulator module 12 and an output 16 of the amplifier module 10 is connected to the antenna 2.

A controller 17 located within the phone 3 controls and monitors the modulator module 12 and the amplifier module 10. For instance, the controller 17 can be associated with a power management system of the phone 3. The power management system is responsible for controlling the power level with which the RF signals are transmitted. The power level depends, for example, on the distance between the phone 3 and a base transceiver station, and the characteristics of a propagation path between the phone 3 and the base transceiver station. The power level requirements are transmitted between the phone 3 and the base transceiver station by means of a communications protocol typically used in CDMA systems. The controller 17 can be the central processing unit (CPU) of the phone 3 or a subprocessor in communication with the CPU. In one embodiment, the power management system is implemented in a subprocessor which communicates with the CPU.

The modulator module 12 of the transmitter module 1 includes two mixer stages formed by mixers 25, 22 in combination with local oscillators 30, 31 respectively. In FIG. 3, the local oscillators 30, 31 are shown as being part of the modulator module 12. However, it is contemplated that the local oscillators 30, 31 can be located at other locations within the phone 3. Further, it is contemplated that the grouping into the modulator module 12 and the amplifier module 10 is arbitrary and that this grouping is for descriptive purposes only.

The mixer 25 is configured as a QPSK modulator (Quadrature Phase Shift Keying) which receives "I" and "Q" components of a baseband signal from the signal processing module 7 and a signal LO1 from the local oscillator 30. In one embodiment, the local oscillator 30 is adjustable so that the signal LO1 has a frequency in a range of about 100 to 640 MHz. The mixer 25 (QPSK modulator) modulates the signal LO1 with the incoming baseband signal so that an intermediate frequency signal results (indicated as "IF" and hereinafter referred to as IF signal). The IF signal includes the desired intermediate frequency, but also undesired frequencies which may cause noise in the IF signal. The IF signal is fed to an amplifier 20 which is controlled by a control signal AGC generated by the controller 17. The controller 17 is connected to the amplifier 20 via a control line 20a.

The amplifier 20 is configured to have a variable gain which is adjusted by the control signal AGC thereby implementing an automatic gain controlled amplifier. In one embodiment, the amplifier 20 has a dynamic range of about 90 dB and the control signal AGC can have a DC voltage between 0.2 V and 2.5 V to control the gain of the amplifier 20.

The amplifier 20 outputs an amplified IF signal to a bandpass filter 21. The bandpass filter 21 has a filter characteristic selected to pass the intermediate frequency and to block the undesired frequencies to reduce noise in the IF signal. In one embodiment, the bandpass filter 21 has a passband of about +/−650 kHz. In FIG. 3, the output of the bandpass filter 21 is indicated as "Filtered IF."

The noise reduced IF signal is fed to the mixer 22. In one embodiment, the mixer 22 can be configured to have a controlled gain variation to calibrate and to compensate for any gain variation in the transmit path. The mixer 22 converts the IF signal to a RF signal using a signal LO2 generated by the local oscillator 31. In one embodiment, the signal LO2 has a frequency of about 955 MHz to 979 MHz. Similar to the mixer 18, the mixer 22 up-converts the IF signal and generates the RF signal comprising the desired radio frequency, but also undesired frequencies. The output of the mixer 22 is indicated as "RF."

The RF signal is fed to a bandpass filter 24. The bandpass filter 24 has a filter characteristic selected to pass the desired radio frequency and to block the undesired frequencies to reduce noise in the RF signal. In one embodiment, the bandpass filter 24 has a passband of about 25 MHz. In FIG. 3, the output of the bandpass filter 21 is indicated as "Filtered RF."

The filter RF signal is fed to an amplifier 26 which is generally configured to amplify RF signals in the 800 MHz range. The amplifier 26 is a drive amplifier for the amplifier module 10. Because amplifier may not be ideally linear, the amplifier 20 can add undesired frequency components to the RF signal. To eliminate these undesired frequency components from the RF signal, an optional bandpass filter 28 is connected between the amplifier 26 and the amplifier module 10.

In FIG. 3, the bandpass filter 28 is connected to the input 14 of the amplifier module 10 which amplifies the RF signal. The amplifier module 10 outputs the amplified RF signal at the output 16 connected to the antenna 2. The antenna 2 emits the RF signal in a conventional manner.

Figure 4:
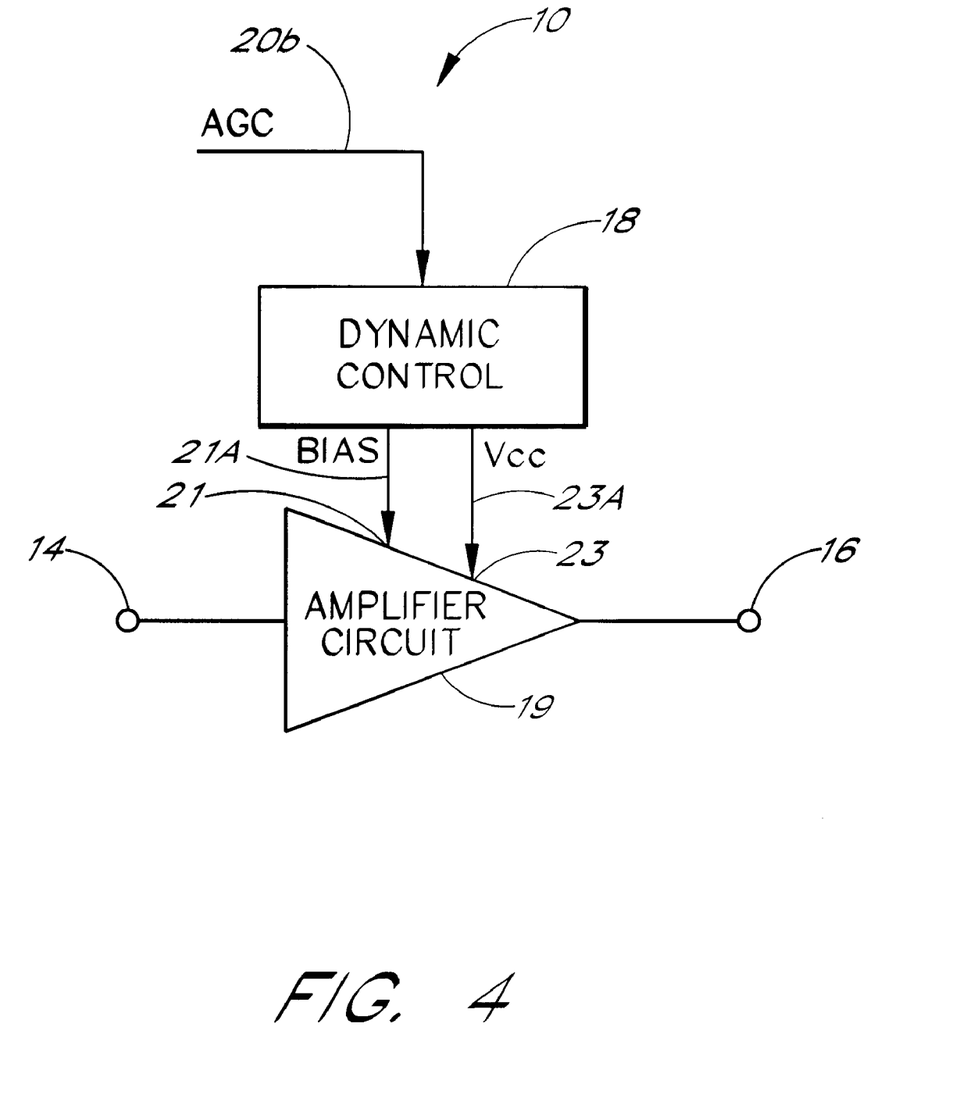
FIG. 4 is a schematic illustration of a transmitter module.

FIG. 4 shows an exemplary block diagram of the amplifier module 10. The amplifier module 10 includes an amplifier circuit 19 connected between the input 14 and the output 16. The amplifier module 10 further includes a control module 18 configured to control the amplifier circuit 19. In one embodiment, the control module 18 is in communication with a control signal AGC input via the control line 20a. Control lines 21A, 23A connect the control module 18 to inputs 21, 23, respectively, of the amplifier circuit 19.

In the illustrated embodiment, the control module 18 generates two control signals BIAS and VCC. The control line 21A conveys the control signal BIAS and the control line 23A conveys the control signal VCC. As described in further detail below, the control signals BIAS, VCC set the amplifier circuit of 19 to have a predefined quiescent and operating point (Q point). The Q point can be determined by a supply voltage (VCC) or a bias voltage/current, or both. The control module 18 is described in more detail below with reference to FIG. 5. The control module 18 controls the amplifier circuit 19 so as to decrease power consumption and, thus, to increase the operating time.

In one embodiment, the control module 18 can be implemented as an integrated circuit comprising DC-DC converters, regulators and switching circuits. Further, the control module 18 can be implemented within an integrated circuit responsible for the power management of the phone 3.

Figure 5:
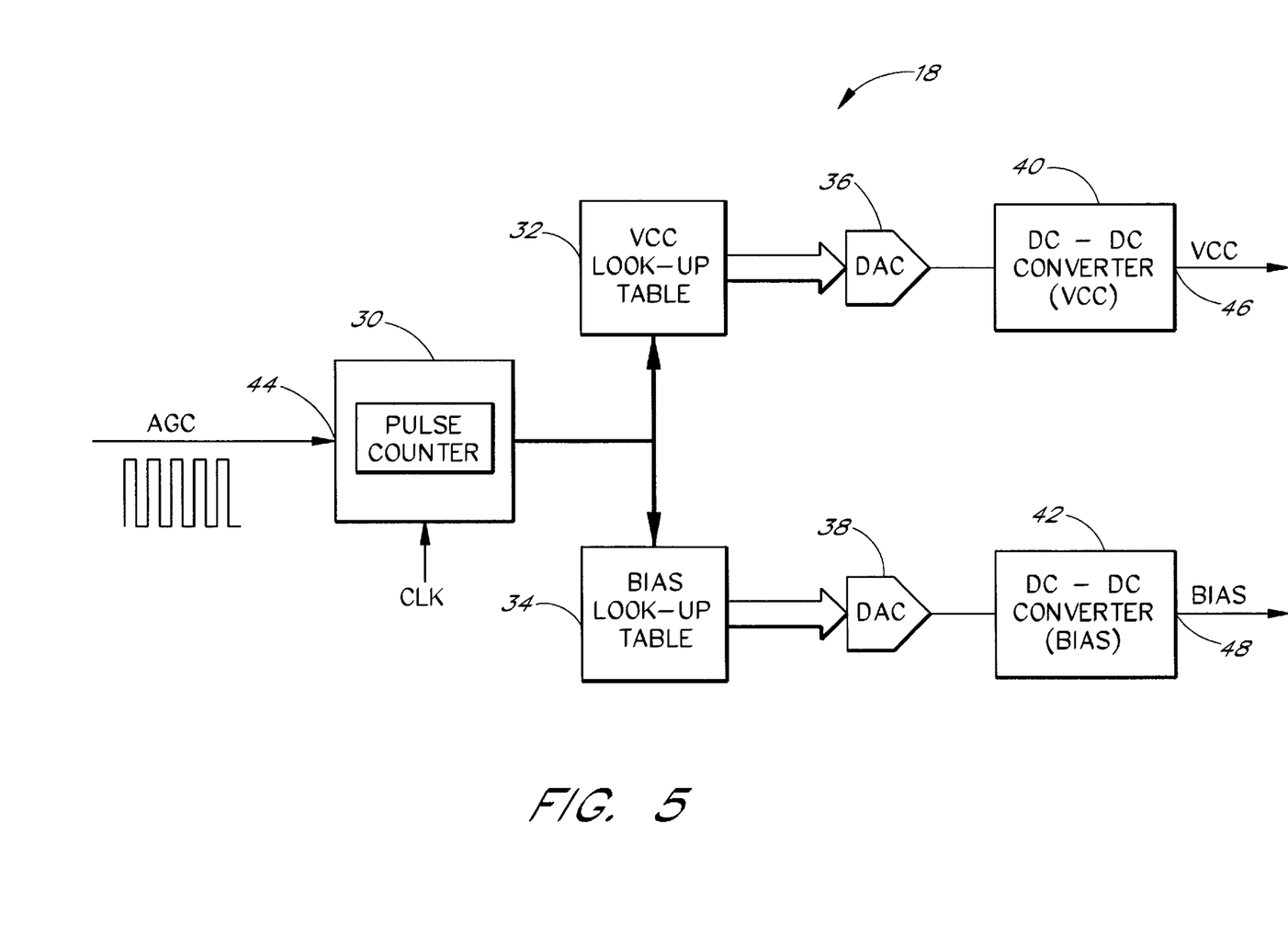
FIG. 5 is a schematic illustration of one embodiment of a control module included in the transmitter module shown in FIG. 4.

FIG. 5 is an exemplary block diagram of the control module 18. The control module 18 has an input 44 for the control signal AGC conveyed via the control line 20b, an output 46 for the control signal VCC, and an output 48 for the control signal BIAS. As shown in FIG. 3, the control signal AGC originates from the controller 17. The controller 17 generates the control signal AGC as a function of the power output of the phone 3. In one embodiment, the control signal AGC is a pulse duration modulated (PDM) signal and exemplary indicated in FIG. 5. The number of pulses within a given count period, the density, is directly proportional to the power output of the phone 3. That is, the higher the power output, the more dense the pulses within the given count period.

It is contemplated that in other embodiments the control signal AGC can be selected so that the amplitude or the phase of the pulses represent the power output of the phone 3. Further, it is contemplated that the control signal AGC can be a digital signal directly representing the power output of the phone 3.

In the illustrated embodiment, the control module 18 includes a pulse counter 30 which receives the PDM signal. The pulse counter 30 is in one embodiment an integrated circuit which counts the pulses within the count period. The count is determined by a clock signal CLK applied to the pulse counter 30. The pulse counter 30 outputs a digital number which corresponds to the power output of the phone 3.

The pulse counter 30 is connected to an input 44 of the control module 18 and to storage locations 32, 34. The storage location 32 is further connected to a digital-to-analog (D/A) converter 36 illustrated as "DAC." The D/A converter 36 is connected to a voltage converter 40, which is in one embodiment a DC-DC converter having an output 46 for the control signal VCC. The storage location 34 is connected to a digital-to-analog (D/A) converter 38 also illustrated as "DAC." The D/A converter 38 is connected to a voltage converter 42, which is in one embodiment a DC-DC converter having an output 48 for the control signal BIAS.

The storage locations 32, 34 receive the digital number output from the pulse counter 30. In one embodiment, each storage location 32, 34 is a non-volatile Read Only Memory (ROM). The storage locations 32, 34 store operating characteristics of the amplifier circuit 19. These operating characteristics are determined during manufacture, for example, during a calibration process of the phone 3, and stored in the ROM. Alternatively, each storage location 32, 34 can be implemented as an Electrically Erasable Programmable Read Only Memory (EEPROM). The EEPROM is a non-volatile storage device in which bytes or words can be erased and reprogrammed individually. In another embodiment, each storage location 32, 34 can be a Flash EEPROM. The storage locations 32, 34 retain their contents even when the power is switched off.

It is contemplated that in alternative embodiments the storage locations 32, 34 can be volatile memories such as Random Access Memories or the like. The phone 3 can be configured that at each power up the operating characteristics of the amplifier circuit 19 are loaded to the storage locations 32, 34. For instance, the phone's CPU can initiate a download from an external or internal data source which provides the operating characteristics.

The storage location 32 stores a look-up table for various digital values used to generate the control signal VCC. Hereinafter, the storage location 32 and the look-up table stored therein are referred to as the VCC look-up table 32. The storage location 34 stores a look-up table for various digital values used for the control signal BIAS. Hereinafter, the storage location 34 and the look-up table stored therein are referred to as the BIAS look-up table 34.

The values of the VCC look-up table 32 represent a variety of individual digital voltage values. In one embodiment, the digital voltage values cover a range of analog voltages (VCC) approximately between 2 and 5 volts. The voltage range covers, thus, voltages typically used for powering an amplifier circuit. Each individual voltage value represents the power supply for the amplifier circuit 19. It is contemplated that the VCC look-up table 32 can store a wider range of voltage values in case the amplifier circuit 19 is operable at a wider range of the power supply.

The VCC look-up table 32 stores the individual voltage values with a fixed relationship to the number of pulses. A specific number of pulses addresses the VCC look-up table 32 which then outputs the digital voltage value assigned to this specific number of pulses. The D/A converter 36 converts the digital voltage value to an analog voltage value. The DC-DC converter 40 adapts the analog voltage value into an adequate voltage value (e.g., 5 volts) for the amplifier circuit 19. The DC-DC converter 40 is configured to convert the voltage value to a higher or lower voltage value.

The values of the BIAS look-up table 34 represent a variety of individual digital voltage values. In one embodiment, the digital voltage values cover a range of analog voltages approximately between 1 and 3 volts. The voltage range covers, thus, voltages typically used for biasing an amplifier circuit. Each individual voltage value can bias the amplifier circuit 19 to a predetermined state.

As the VCC look-up table 32, the BIAS look-up table 34 stores the individual voltage values with a fixed relationship to the number of pulses. A specific number of pulses addresses the BIAS look-up table 32 which then outputs the digital voltage value assigned to this specific number of pulses. The D/A converter 38 and the DC-DC converter 42 process the voltage value as described above.

The digital values stored in the VCC look-up table 32 and the BIAS look-up table 34 define the quiescent operating point of the amplifier circuit 19. A pair of VCC and BIAS values sets a predetermined operating point which increases efficiency for a specific power output of the phone 3.

The control module 18 dynamically controls the power supply and the bias voltage applied to the amplifier circuit 19 so that the amplifier module 10 achieves increased power efficiency. The power efficiency of an amplifier at a given output power is a function of the power supply and a quiescent current determined by the bias voltage. The look-up tables 32, 34 map the control signal AGC to values for the power supply (VCC) and the bias voltage. This provides for an increased power efficiency over a wide dynamic range.

Specific pairs for the values of the power supply and the bias voltage are hereinafter referred to as the "VCC/BIAS pairs." It is contemplated that in some embodiments one of the VCC and BIAS values remains constant, although different VCC/BIAS pairs are selected.

The amplifier circuit 19 consumes electrical power which is in some cases proportional to the consumed current. The consumed current typically indicates the consumed power and the power efficiency. Generally, the power efficiency increases with increasing output power, as shown in FIG. 6B.

Figure 6A:
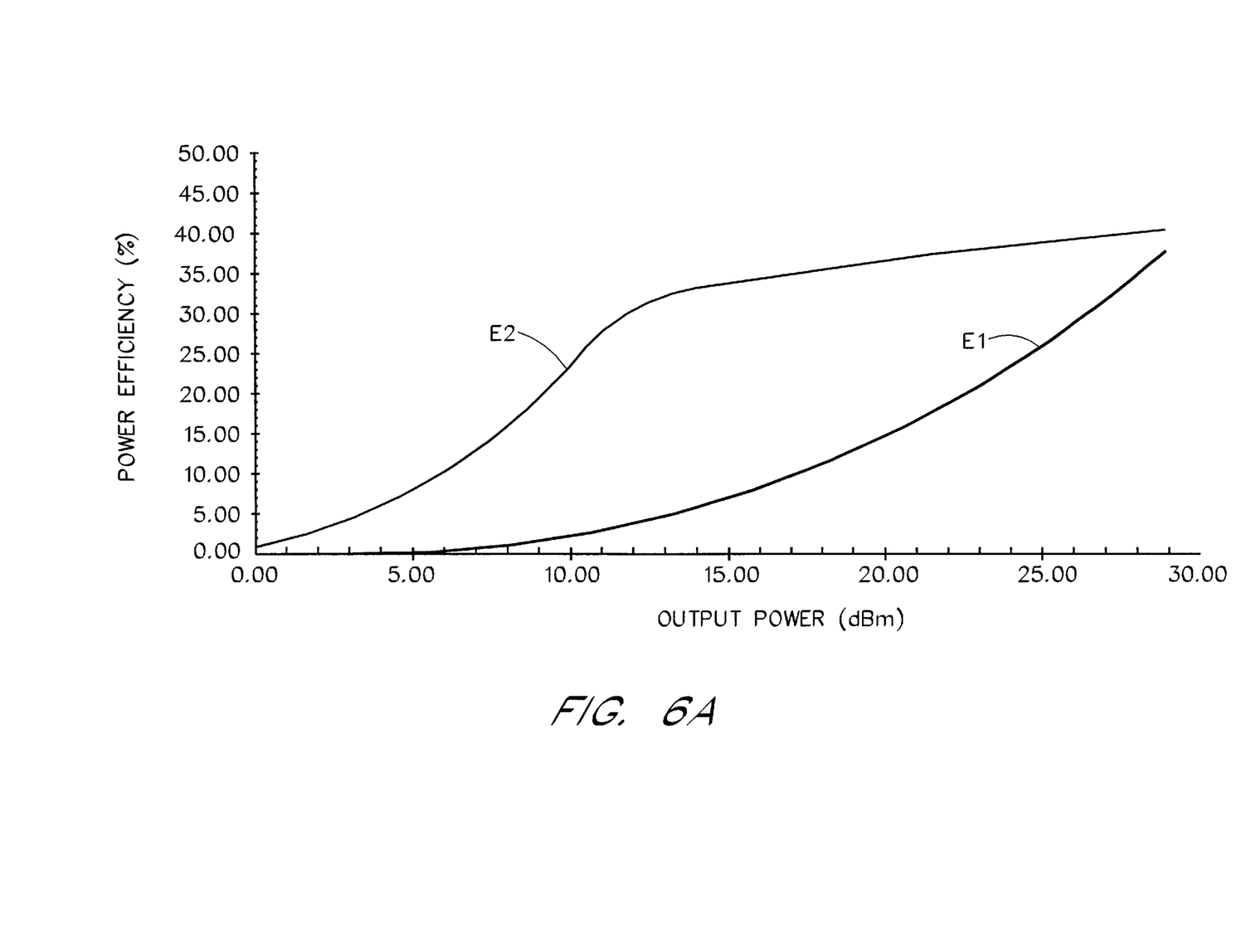
FIG. 6A shows graphs illustrating power efficiencies as a function of the output power of a power amplifier.
Figure 6B:
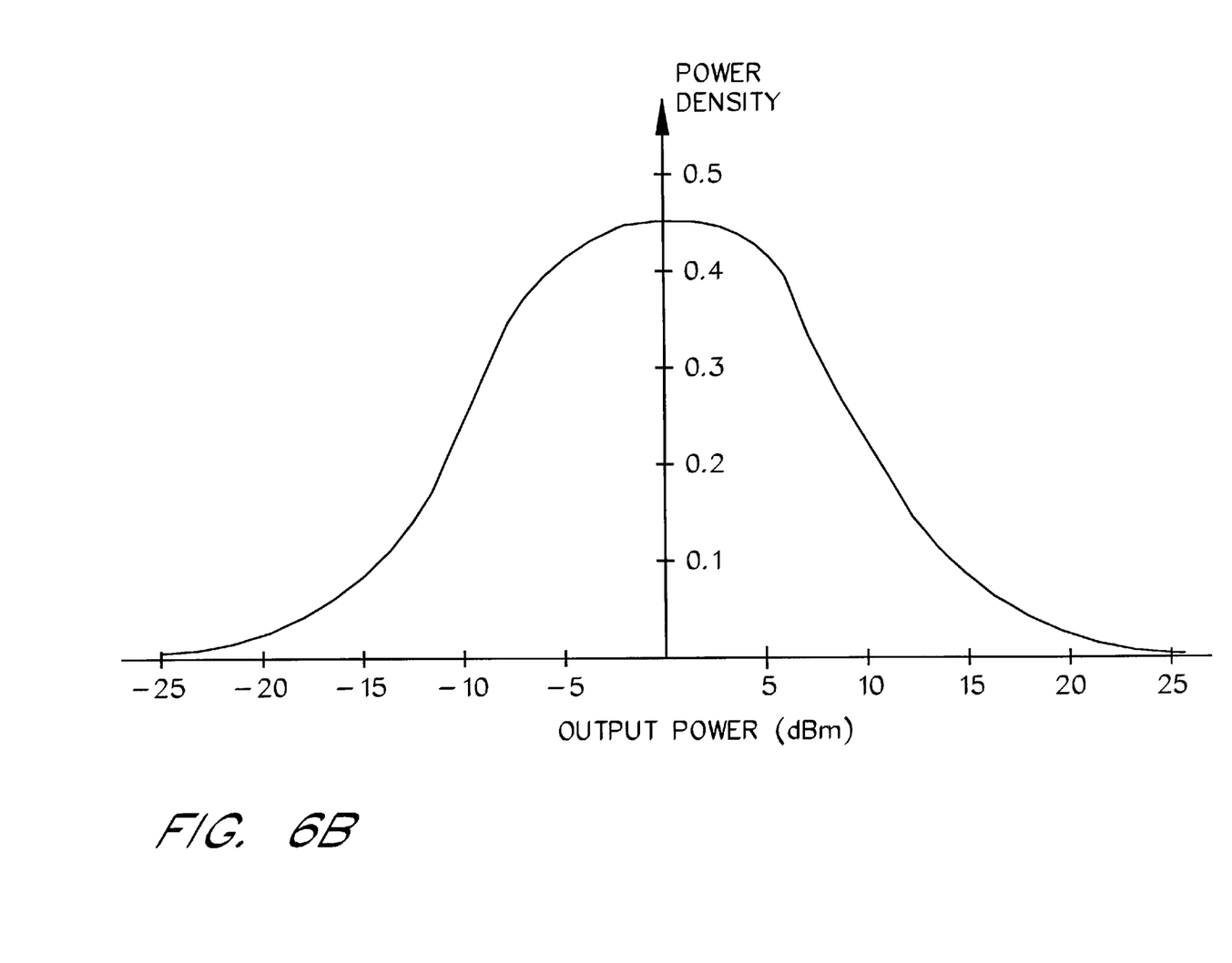
FIG. 6B shows a graph illustrating a power density as a function of the output power of a power amplifier.

FIG. 6A shows exemplary grades, labeled as E1, E2, illustrating power efficiencies (in %) as a function of the output power (in dBm, reference to a power of 1 mW). The graph E1 illustrates the power efficiency of an amplifier circuit having no control module 18. That is, this amplifier circuit operates at the single, invariable VCC/BIAS pair. Contrary to that, the graph E2 illustrates the power efficiency of the amplifier circuit 19 with the control module 18. That is, the graph E2 is generated through a plurality of VCC/BIAS pairs as described above.

As shown in FIG. 6A, the power efficiency generally increases with an increasing output power. For example, with respect to graph E1, the power efficiency is about 3% at an output power of 10 dBm, about 15% at an output power of 20 dBm, about 30% at an output power of 25 dBm. The power efficiency is very low at relatively low output powers, for example, below 20 dBm.

The amplifier circuit 19 including the control module 18, however, has an improved power efficiency (graph E2), particularly at lower output powers. This improvement of the power efficiency is preferable since the phone 3 statistically operates most of the time at lower power levels as shown in FIG. 6B.

FIG. 6B is a diagram exemplary illustrating a probability density PD as a function of the output power in a range between −25 dBm and 25 dBm. The probability density PD is generally bell-shaped with a center at about 0 dBm. In this illustration, the phone 3 statistically operates most of time at low power levels, for example, between approximately +/−10 dBm.

The control module 18 provides particularly at these power levels higher power efficiencies. Further, as shown in FIG. 6B, the improved power efficiencies extend over a broad dynamic range of power levels.

As described above, the output power of the phone 3 is determined, inter alia, by the distance between the phone 3 and a transceiver station. For instance, in one embodiment, the amplifier circuit 19 is initially set to operate at the first VCC/BIAS pair and at an output power of 25 dBm. The power efficiency is in this case about 30%. If the output power of the phone 3 is reduced, for example, because the phone 3 moved closer to the transceiver station, the controller 17 initiates a reduction of the output power, for example, to about 20 dBm. As a consequence thereof, the power efficiency would, without the control module 18, drop to about 15%.

The reduced power, however, would change the PDM signal so that the number of pulses counted would change. A different number, however, addresses a different VCC/BIAS pair. At the reduced output power of 20 dBm and operated by the second VCC/BIAS pair, the amplifier circuit 19 has a power efficiency of about 30% which is approximately equal to the power efficiency before the reduction.

Similarly, if the output power is further reduced, for example, to 15 dBm, the pulse counter 30 counts a different number of pulses within the count period, so that another VCC/BIAS pair is addressed. At the reduced output power of 15 dBm and this new VCC/BIAS pair, the amplifier circuit 19 has, again, a power efficiency of about 30%.

Figure 7:
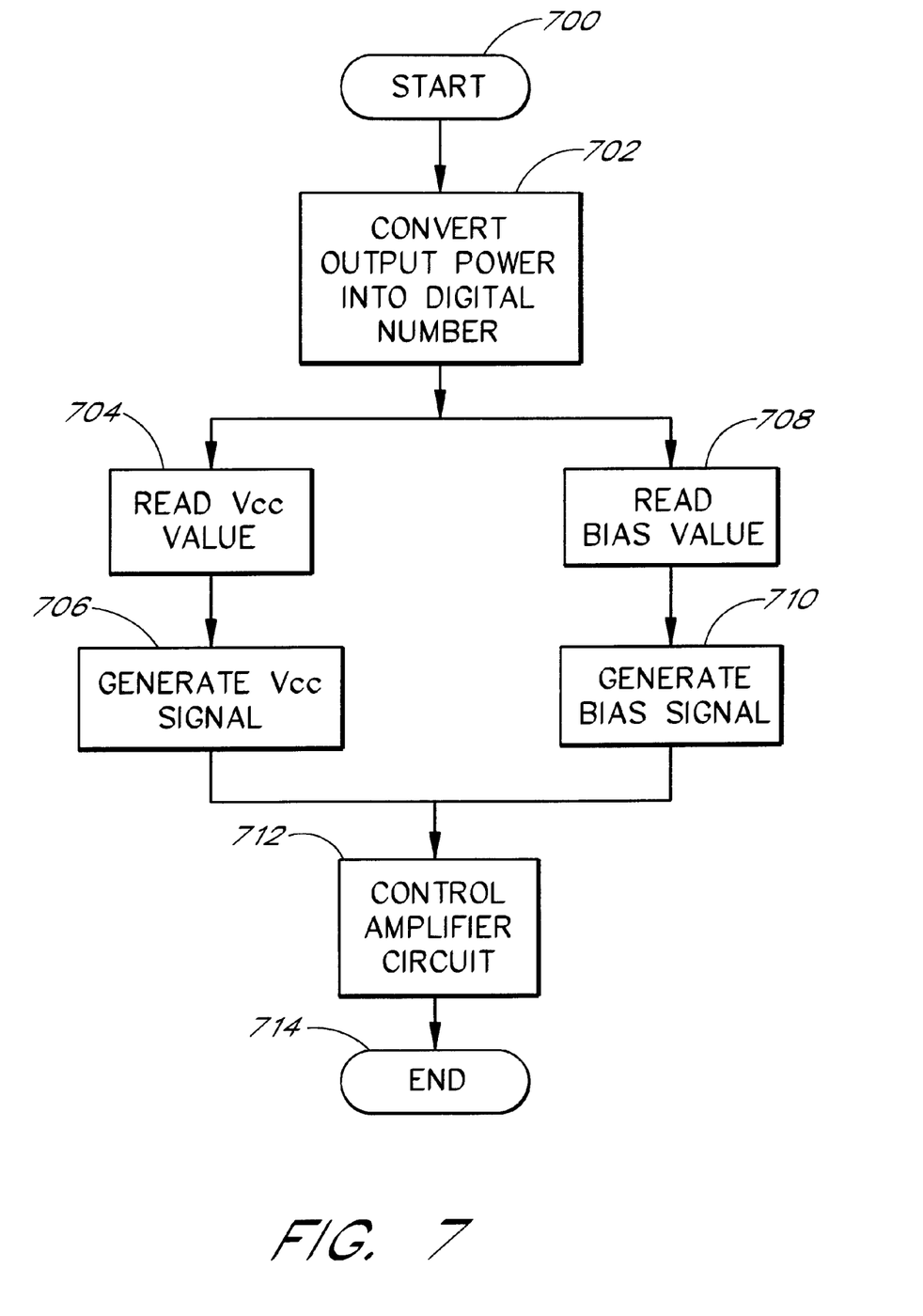
FIG. 7 shows a flow chart of a control procedure.

FIG. 7 shows a flow chart of a control procedure for the amplifier module 10. At power up of the phone 3, the procedure is reset and initialized, as represented in start block 700.

Proceeding to step 702, the procedure converts the PDM signal, which corresponds to the output power at which the phone 3 currently transmits, into a digital number. The conversion is performed by the pulse counter 30. As described above, the output power is determined, inter alia, by the distance between the phone 3 and the transceiver station. The controller 17 or the phone's CPU processes a signal, for example, received from the transceiver station which requires the phone 3, for example, to decrease the output power for about 5 dBm.

Proceeding to step 704, the procedure uses the digital number to address the VCC look-up table 32 and to read the VCC value that corresponds to the digital number and, thus, to the output power.

Proceeding to step 706, the procedure generates the control signal VCC by converting the VCC value into an analog value and adjusting a voltage level of the control signal VCC.

Proceeding to steps 708, 710, these steps 708, 710 occur in one embodiment in parallel to the steps 704, 706. In step 704, the procedure uses the digital number to address the BIAS look-up table 34 and to read the BIAS value that corresponds to the digital number and, thus, to the output power.

In step 710, the procedure generates the control signal BIAS by converting the BIAS value into an analog value and adjusting a voltage level of the control signal BIAS.

Proceeding to step 712, the procedure uses the VCC/BIAS pair generated by the steps 706, 710 to control the amplifier circuit 19. As discussed above, the VCC/BIAS pair improves the efficiency of the amplifier circuit 19 for the 5-dBm output power decrease. The procedure ends at block 714.

The described embodiment of the amplifier module 10 dynamically adapts to changing output power requirements to achieve an improved power efficiency over a wide range of output power. The control module 18 dynamically varies the operating parameters of the amplifier circuit 19. The improved power efficiency improves the operating time of the wireless communications device.

While the above detailed description has shown, described and identified several novel features of the invention as applied to a preferred embodiment, it will be understood that various omissions, substitutions and changes in the form and details of the described embodiments may be made by those skilled in the art without departing from the spirit of the invention. Accordingly, the scope of the invention should not be limited to the foregoing discussion, but should be defined by the appended claims.

What is claimed is:

1. A wireless communications device having an amplifier module which is configured to amplify the radio frequency signal with increased efficiency, the amplifier module comprising:
   an input terminal which receives a control signal comprising a plurality of pulses, wherein the number of pulses within a predetermined time period identify a desired power output level;
   a control circuit in communication with the control signal, the control circuit comprising at least one counter which counts the number of pulses occurring within the predetermined time period to generate a control value;
   a first memory array in communication with the control value, the first memory array comprising multiple entries, each entry comprising a power value, wherein the first memory outputs the power value which corresponds to the control value that is indicative of the desired power output level;
   a second memory array in communication with the control value, the second memory array comprising multiple entries, each entry comprising a bias value, wherein the second memory outputs the bias value which corresponds to the control value; and
   an amplifier circuit which is in communication with the power value, the bias value and a radio frequency signal, the amplifier circuit configured to vary the amplification of the radio frequency signal based on the power and bias values wherein the power and bias values increase the efficiency of the amplifier at the desired power level.

2. The communications device of claim 1, wherein the power values determine the amount of power voltage applied to the amplifier circuit.

3. The communications device of claim 1, wherein the bias values determine the amount of bias voltage applied to the amplifier circuit.

4. The communications device of claim 1, wherein the first and second memory arrays are located in a single memory array.

5. The communications device of claim 1, wherein the power value is a digital power value.

6. The communications device of claim 5, further comprising a digital-to-analog converter which converts the digital power value to an analog power value.

7. The communications device of claim 1, wherein the bias value is a digital bias value.

8. The communications device of claim 5, further comprising a digital-to-analog converter which converts the digital bias value to an analog bias value.

9. The device of claim 1 wherein the radio frequency signal is a GSM communications signal.

10. The device of claim 1 wherein the radio frequency signal is a CDMA communications signal.

11. The device of claim 1 wherein the radio frequency signal is a PCS communications signal.

12. The device of claim 1 wherein the radio frequency signal is an AMPS communications signal.

13. The device of claim 1 wherein the radio frequency signal is compatible with the code division multiple access (CDMA) standard.

14. The device of claim 1 wherein the radio frequency signal is compatible with the frequency division multiple access (FDMA) standard.

15. The device of claim 1 wherein the radio frequency signal is compatible with the time division multiple access (TDMA) standard.

16. An amplifier control circuit comprising:
   an input which receives a first signal indicative of a desired output power level, wherein the first signal includes pulses that are indicative of the desired output power level;
   a memory comprising plurality of data values wherein the data values represent amplifier operational values; and
   a control circuit in communication with the input and the memory, the control circuit comprising a counter, which counts the pulses to generate a count value that is indicative of the desired power output level, wherein the count value is configured to address data values in the memory in, wherein the memory outputs the addressed data values.

17. The circuit of claim 16, wherein the first signal includes pulses of varying duration which are indicative of the desired power level.

18. The circuit of claim 17, wherein the control circuit includes a counter which counts the pulses to generate a value representing the counted pulses within a predetermined period of time, the value being indicative of the desired power level.

19. The circuit of claim 16, wherein the data values represent values for powering an amplifier circuit.

20. The circuit of claim 16, wherein the data values represent values for biasing an amplifier circuit.

21. The circuit of claim 16, wherein the first signal is a digital signal.

22. The circuit of claim 16, wherein the first signal transmits a digital value.

23. A method for increasing the power efficiency of an amplifier module comprising the acts of:

receiving a first control signal indicative of a power level output of an amplifier module, wherein the first control signal corresponds to pulses that are indicative of the power output level;

counting the pulses to generate a count value that is indicative of the power output level;

using the count value to address memory locations, each memory location storing at least one operating characteristic of the amplifier module; and reading from the addressed storage locations to generate at least a second control signal, the second control signal configured to increase the power efficiency of the amplifier module.

24. The method of claim 23, wherein the control signal is a pulse duration modulation signal.

25. The method of claim 23, wherein the act of counting the pulses of the control signal within a predetermined period of time generates the count value.

26. The method of claim 23, further comprising the act of using the count value to address the storage locations.

* * * * *